United States Patent
He et al.

(10) Patent No.: US 7,808,406 B2
(45) Date of Patent: Oct. 5, 2010

(54) METHOD AND APPARATUS FOR REALIZING ARITHMETIC CODING/DECODING

(75) Inventors: Yun He, Shenzhen (CN); Wei Yu, Shenzhen (CN); Ping Yang, Shenzhen (CN); Xinjian Meng, Shenzhen (CN)

(73) Assignees: Huawei Technologies Co., Ltd., Shenzhen (CN); Tsinghua University, Beijing (CN)

( * ) Notice: Subject to any disclaimer, the term of this patent is extended or adjusted under 35 U.S.C. 154(b) by 64 days.

(21) Appl. No.: 12/133,222

(22) Filed: Jun. 4, 2008

(65) Prior Publication Data

US 2008/0240597 A1    Oct. 2, 2008

Related U.S. Application Data

(63) Continuation of application No. PCT/CN2006/003292, filed on Dec. 5, 2006.

(30) Foreign Application Priority Data

Dec. 5, 2005    (CN) .................. 2005 1 0127532

(51) Int. Cl.
*H03M 7/30* (2006.01)
(52) U.S. Cl. ..................................... 341/107
(58) Field of Classification Search ................. 341/107
See application file for complete search history.

(56) References Cited

U.S. PATENT DOCUMENTS

| | | | |
|---|---|---|---|
| 4,286,256 A * | 8/1981 | Langdon et al. ............. 341/107 |
| 4,652,856 A * | 3/1987 | Mohiuddin et al. ........... 341/60 |
| 4,791,403 A * | 12/1988 | Mitchell et al. ............... 341/51 |
| 4,933,883 A * | 6/1990 | Pennebaker et al. ......... 341/107 |
| 4,989,000 A * | 1/1991 | Chevion et al. .............. 341/107 |
| 6,049,630 A | 4/2000 | Wang et al. |
| 6,393,160 B1 | 5/2002 | Edgar |

FOREIGN PATENT DOCUMENTS

| CN | 1561056 A | 1/2005 |
|---|---|---|
| WO | WO 99/46729 A1 | 9/1999 |

OTHER PUBLICATIONS

H.264—Advanced video coding for generic audiovisual services, Telecommunication Standardization Sector of ITU, Edition includes modifications introduced by ITU-T Rec. H264 (2003) Corrigendum 1 approved on May 7, 2004, International Telecommunication Union, Geneva, Switzerland.

(Continued)

*Primary Examiner*—Howard Williams
(74) *Attorney, Agent, or Firm*—Leydig, Voit & Mayer, Ltd

(57) ABSTRACT

A method and apparatus for performing arithmetic encoding/decoding in an arithmetic encoder is disclosed. It comprises: firstly, when performing binary arithmetic encoding/decoding in the arithmetic encoder, an interval update process for arithmetic encoding/decoding to be performed in the original domain is mapped to the logarithm domain, and the interval update computation is implemented with direct add/subtract operations; during arithmetic encoding/decoding in the logarithm domain, data conversions between the original domain and the logarithm domain are performed by approximations; and after encoding/decoding a symbol, its probability is updated when necessary, the update being performed with add/subtract operations in the logarithm domain. It can be seen that with the arithmetic encoding/decoding solutions of the disclosure, the arithmetic encoding/decoding process and the probability estimation involved therein are mapped to the logarithm domain. Data conversions between the original domain and the logarithm domain are performed by means of approximation equations. Accordingly, complicated computations and table looking-up are avoided effectively. Therefore, the disclosure provides a simple, efficient and suitable solution for performing arithmetic encoding/decoding.

17 Claims, 2 Drawing Sheets

OTHER PUBLICATIONS

"H.264—Advanced video coding for generic audiovisual services," Telecommunication Standardization Sector of ITU, edition includes text approved Mar. 2005 and a Corrigendum 1 approved Sep. 2005, International Telecommunication Union, Geneva, Switzerland.

Specification of "H.264—Advanced video coding for generic audiovisual services," Telecommunication Standardization Sector of ITU, International Telecommunication Union, 2003, Geneva, Switzerland.

* cited by examiner

2

METHOD AND APPARATUS FOR REALIZING ARITHMETIC CODING/DECODING

CROSS-REFERENCE TO RELATED APPLICATIONS

This application is a continuation of International Patent Application No. PCT/CN2006/003292, filed Dec. 5, 2006, which claims priority to Chinese Patent Application No. 200510127532.2, filed Dec. 5, 2005, both of which are hereby incorporated by reference in their entirety.

FIELD OF THE INVENTION

The invention relates to the field of image coding techniques, and more particularly, to an arithmetic encoding/decoding technique for use in image coding of an arithmetic encoder.

BACKGROUND

Arithmetic coding process is involved in image coding process. With arithmetic coding, the information entropy of a code symbol sequence is approximated by mapping the sequence to a value within an interval of [0, 1), so as to achieve a desired data compression ratio. During an arithmetic coding process, it is necessary to perform iteration on the current encoding interval according to the probability of each symbol within a set of code symbols. Once this process is complete for the code sequence, an interval corresponding to the whole sequence may be obtained. A value selected from this interval may represent the information of the whole sequence.

The encoding of the arithmetic codes may be divided into two phases: in the first phase, the probability of each source symbol is calculated so as to assign an appropriate symbol interval; and in the second phase, symbols are input and the sequence is encoded. Here, the probabilities of the symbols may be obtained on the basis of a priori knowledge in the first phase of encoding.

The second phase of encoding is an iteration procedure, mainly including:

(1) defining the current interval as [0,1);

(2) for each symbol of the input stream, repeating the following two steps:

(21) dividing the current interval into sub-intervals having lengths proportional to the probability of the symbol; and

(22) selecting a sub-interval for the current symbol and define it as the current interval; and (3) processing all the symbols in the above manner, and finally outputting a value uniquely defining the current interval as the coded codeword.

The above arithmetic coding lies mainly in the iteration process of intervals. The probabilities of the symbols during the iteration process may be determined on basis of a self-adaptive model.

If there are only two symbols of 0 and 1 in the symbol set, the above procedure may be simplified. In this case, the most probable symbol and the least probable symbol are designated abbreviated as MPS and LPS, respectively. If R represents the current interval, Low represents the lower bound of the current interval, $p_{LPS}$ represents the probability of LPS, $p_{MPS}$ represents the probability of MPS, and $p_{LPS}+p_{MPS}=1$, the above iteration may be given by the following equations:

$$R_{LPS}=R \times p_{LPS}, R_{MPS}=R-R_{LPS};$$

When encoding LPS, $R=R_{LPS}$;

Low=Low+$R_{MPS}$;

When encoding MPS, $R=R \times p_{MPS}=R-R_{LPS}$.

The above equations provide an explanation to the principle of the arithmetic coding method. In practical applications, the above algorithm can not be employed directly due to a limited precision and the implementation complexity of multipliers. In addition, self-adaptive probability estimation is usually used to calculate the probabilities of the symbols so as to improve the coding efficiency of the arithmetic codes.

The presently used arithmetic encoders all employ a renormalization process to solve the problems caused by the limited precision. Various solutions are proposed for the multiply operations, which include: in the arithmetic encoder of Q-Coder applied in the JPEG standard, the multiply operations are avoided by using approximations which limits R in an interval of [0.75, 1.5); and in the arithmetic encoder of CABAC used in the H.264/AVC standard, the multiply operations are avoided with the aid of a look-up table. For the self-adaptive update of the probabilities, the multiply operations may be avoided by using Finite State Machine (FSM) algorithms. Specifically, probability estimation is performed by choosing different jump schemes for MPS and LPS from a state transition table.

Currently, arithmetic encoders performing arithmetic coding in the logarithm domain have also been proposed, and thus the multiply operations may be avoided by mapping from the original domain to the logarithm domain. However, in such an encoder, data conversions between the original domain and the logarithm domain are implemented with a logarithm table and an inverse logarithm table. Probability update is also performed in the original domain by means of a state transition table. With the introduction of those tables, it more storage is required, and the implementation is more complex with the complicated look-up operations. Therefore, it is difficult to implement the solution on a personal computer (PC).

SUMMARY

The disclosure provides a method and apparatus for performing arithmetic encoding/decoding, which may simplify the arithmetic encoding/decoding process, and make it easier to implement the arithmetic encoding/decoding.

The disclosure provides a method for performing arithmetic encoding, including:

performing arithmetic encoding on data to be encoded;

mapping an interval update computation for arithmetic encoding to be performed in the original domain into the logarithm domain and implementing the interval update computation with add/subtract operations; data conversions between the original domain and the logarithm domain being performed by approximations; and performing arithmetic encoding according to the interval update computation result.

The disclosure also provides an apparatus for performing arithmetic encoding, including:

a symbol encoding interval updating unit, configured to map an interval update computation for arithmetic encoding to be performed in the original domain to the logarithm domain and implement the interval update computation with add/subtract operations, and perform data conversions between the original domain and the logarithm domain by approximations; and an encoding operation unit, configured to perform arithmetic encoding with an interval update result computed by the symbol encoding interval updating unit.

The disclosure also provides a method for performing arithmetic decoding, including:

performing arithmetic decoding on data to be encoded;

mapping an interval update computation for arithmetic decoding to be performed in the original domain to the logarithm domain and implementing the interval update computation with add/subtract operations, data conversions between the original domain and the logarithm domain being performed by approximations; and performing arithmetic decoding according to the interval update computation result.

The disclosure also provides an apparatus for performing arithmetic decoding, including:

a symbol decoding interval updating unit, configured to map an interval update computation to be performed for arithmetic decoding in the original domain to the logarithm domain and implement the interval update computation with add/subtract operations directly, and perform data conversions between the original domain and the logarithm domain by approximations; and a decoding operation unit, configured to perform arithmetic decoding with an interval update result computed by the symbol decoding interval updating unit.

It can be seen from the technical solutions of the disclosure that the arithmetic encoding/decoding implementation of the invention maps the arithmetic encoding/decoding procedure and the probability estimation involved therein to the logarithm domain. Data conversions between the original domain and the logarithm domain are performed by means of approximation equations. Accordingly, complicated computations and table looking-up may be avoided effectively. By performing probability update in the logarithm domain, a probability update may be determined by simple computations instead of using a state transition table.

In summary, the implementation of the disclosure not only maintains the precision of the algorithm, but also significantly reduces the complexity of the arithmetic coding computation and the possibility estimation, which facilitates the implementation of the arithmetic encoding/decoding solution. As a result, the disclosure provides a simple, efficient and suitable implementation for performing arithmetic encoding/decoding.

DETAILED DESCRIPTION

Figure 1:
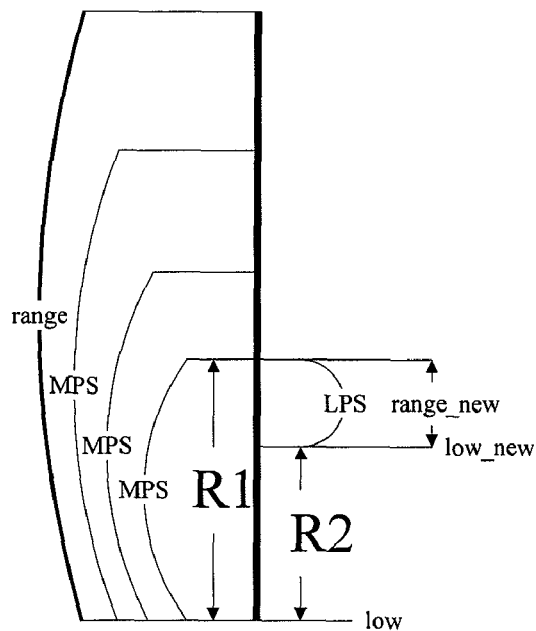
FIG. 1 is a schematic diagram illustrating an embodiment of the arithmetic encoding process according to the invention.

According to the disclosure, the arithmetic encoding process and the involved operations for probability estimation are mapped to the logarithm domain.

In other words, if $R = R \times p_{MPS}$ in the original domain, and assuming the following equations hold true in the logarithm domain:

$$LG\_Range = \log(R), LG\_PMPS = -\log(p_{MPS})$$

it then follows that in the logarithm domain:

$$LG\_Range = LG\_Range - LG\_PMPS \quad (1)$$

It can be seen that in the case of MPS, the update of the interval R may be performed through add/subtract operations in the logarithm domain.

Detailed descriptions will be made first to an arithmetic encoding process for a better understanding of the disclosure. During the arithmetic encoding process, it mainly involves the mapping of a binary symbol sequence to an interval R in the domain. The probability for one of the binary symbols is Q, designated as the first probability, and the probability of another binary symbol is P, designated as the second probability. The two symbols may be MPS and LPS, respectively. When calculating the interval R, by multiplying R with P or Q according to the binary symbols to be coded, a new R may be derived.

The disclosure provides specific embodiments for implementation of the above arithmetic encoding process. Specifically, when calculating the interval R in the logarithm domain, the interval update may be determined by adding the logarithm of P (Log _P) or that of Q (Log _Q) to the logarithm of R (Log _R). Approximations may be used to perform conversions between the logarithm domain and the original domain.

During the process of calculating the interval R, self-adaptive updating of the probabilities Q and P is involved, which is performed also in the logarithm domain.

Specifically, the calculation of the updated Log _Q (or Log _P) in the logarithm domain includes the following.

A new probability in the logarithm domain (i.e., an updated probability in the logarithm domain) may be derived by adding/subtracting a predetermined value to/from the non-updated probability in the logarithm domain. Alternatively, the new probability in the logarithm domain may be derived by adding/subtracting a shifted value of the non-updated probability in the logarithm domain Log _Q (or, Log _P) to/from the non-updated probability in the logarithm domain, or by dividing the non-updated probability in the logarithm domain by 2 raised to the power of an integer.

When performing the conversion from the logarithm domain to the original domain, a value X in the original domain is derived by shifting a parameter B by A bits to the left or to the right, or by dividing the parameter B by 2 raised to the power of A, where the parameters A and B are obtained from the corresponding Log _X in the logarithm domain for the value X. Specifically, Log _X in the logarithm domain is decomposed into Log _X = −A+B−1, where A is an integer, and B−1 is a fraction whose absolute value is less than 1. The parameter B may be corrected with a first correcting parameter Δ1, where Δ1 may be determined by means of a look-up table. The value X in the original domain may be an interval value or a probability value in the original domain.

For a conversion process from the original domain to the logarithm domain, Log _X in the logarithm domain corresponding to the value X in the original domain may be obtained by approximations. Also, Log _X in the logarithm domain corresponding to the value X in the original domain is equal to X−1. Meanwhile, when computing Log _X, it may be corrected by selecting a second correcting parameter Δ2, where Δ2 may be obtained via a look-up table. Here, both Δ1 and Δ2 for correcting the parameter B may be from the same look-up table, that is, the corresponding correcting parameters may be determined by referring to the same look-up table.

The complete arithmetic encoding procedure will be described in detail with reference to specific examples. A specific encoding process may include processes, such as initialization, MPS encoding and LPS encoding.

The initialization process is mainly used to set some initial parameters for subsequent MPS encoding and LPS encoding processes.

The MPS encoding is relatively simple, and the detailed encoding procedure will be described later.

The LPS encoding may further include updating the interval values (including update of the intervals and the lower limits of the intervals) and updating the probabilities, as well as renormalization and updating the parameters according to the updated intervals.

Descriptions will be given below to each process.

(I). Initialization

---

Let HALF = 0x1000, QUARTER = 0x0100, and
range = HALF − 1, where range is the interval value;
LG_range = QUARTER − 1; and
low = 0

---

(II). When MPS is encoded, a new corresponding range (interval) value may be determined by multiplying the original range value with the probability of MPS, that is: new range=original range×$p_{MPS}$, and low keeps unchanged.

When mapping to the logarithm domain, the multiplication may be implemented by add/subtract operations in the logarithm domain. As shown in FIG. 1:

$$NEW LG\_Range = ORG LG\_Range - LG\_PMPS$$

After encoding, the probability of the MPS symbol may be updated when necessary. As the probability $p_{MPS}$ of the MPS symbol increases, the corresponding LG_PMPS decreases. Thus, update of the probability in the logarithm domain may be implemented by simple shifting and add/subtract operations. In the original domain:

$$p_{MPS} = 2^{-LG\_MPS} = \frac{1}{2}(2 - LG\_PMPS),$$

$$p_{LPS} = \frac{1}{2} LG\_PMPS.$$

When encoding the MPS symbol, it is considered that $$p_{LPS} = \frac{15}{16} p_{LPS}.$$

From the above equation $$\left(p_{LPS} = \frac{1}{2} LG\_PMPS\right),$$

it may be computed that LG_PMPS=LG_PMPS−LG_PMPS>>4. That is to say, the updated probability of MPS in the logarithm domain (LG_PMPS) may be determined by subtracting a value from the non-updated probability of MPS in the logarithm domain (LG_PMPS), where the value is determined by shifting the non-updated probability LG_PMPS of MPS in the logarithm domain to the right by 4 bits (LG_PMPS>>4).

The updated probability of MPS in the logarithm domain may also be obtained by dividing the non-updated probability of MPS in the logarithm domain (LG_PMPS) by 2 raised to the power of an integer. Further referring to the above example, it is as follow:

$$LG\_PMPS = LG\_PMPS - LG\_PMPS/16.$$

(III). When LPS is encoded, it is illustrated in FIG. 1.

First, assume that the current encoding interval in the original domain is $R_1$, and the interval corresponding to MPS is $R_2$. In the original domain, range=range×$p_{LPS}$=range−range_MPS, and low needs an increase:

$$range\_new = R_1 - R_2 \quad (2)$$

$$low\_new = low + R_2; \quad (3)$$

When implementing the algorithm, the corresponding values of $R_1$ and $R_2$ are LG_$R_1$ and LG_$R_2$ in the original domain respectively. First, LG_$R_1$ and LG_$R_2$ may be decomposed as:

$$LG\_R_1 = -s_1 + t_1 \quad (4)$$

$$LG\_R_2 = -s_2 + t_2 \quad (5)$$

where $s_1$ and $S_2$ are integers, $t_1$ and $t_2$ are fractional parts within the interval [0,1).

It follows that, $$R_1 = 2^{LG\_R_1} = 2^{-s_1+t_1} \approx 2^{-s_1} \times (1+t_1-\Delta_1) \quad (6)$$

$$R_2 = 2^{LG\_R_2} = 2^{-s_2+t_2} \approx 2^{-s_2} \times (1+t_2-\Delta_2) \quad (7)$$

where $\Delta_i$ is the correcting value for approximation, which may be acquired by referring to a look-up table. The correcting value $\Delta_i$ may also be ignored in the above two equations.

For example, for LG_R=−2561 g ($R_1$)=−506, $$R_1 2^{-1.9765625} \approx 2^{-2} \times (1+0.0234375) = 2^{-(2+8)} \times (1.0234375) \times 256 = 2^{-10} \times 262.$$

Accordingly, $s_1$ 32 2, $t_1$=0.0234375.

An 8-bit precision may be used in practical algorithms. The first 8 bits denote the integral part and the last 8 bits denote the fractional part. The corresponding process is:

$$LG\_R_1 = -506 = -0x01.fa = -0x0200 + 0x0006,$$

where $R_1 = 2^{-0x0200} \times (0x0106)$, for a register with a precision of 8 bits, $1 \leq t < 2$. The fractional part of t, such as 0x 06 in the above example, is stored with 8 bits. For s, only the integral part 0x02 needs to be saved (the fractional part being 0).

Now, equations (6) and (7) are substituted into equations (2) and (3). $R_1 > R_2 \geq R_1/2$, and thus $s_1 = s_2$ or $s_1 = s_2 - 1$.

It follows that, $$range\_new = R_1 - R_2 = 2^{-s_2} \times t_3 \quad (8)$$

$$low\_new = low + R_2 \quad (9)$$

where $$t_3 = \begin{cases} t_1 - t_2 & \text{if } (s_1 = s_2) \\ 2t_1 - t_2 & \text{if } (s_1 \neq s_2) \end{cases}.$$

R2 may be derived from equation (7).

The update of range and low may be implemented with equations (8) and (9).

After encoding the LPS symbol, the corresponding symbol probability LG_PMPS has to be updated as well, which will be described in detail in the following.

During the probability updating process, because the probability of LPS increases, and the probability of MPS decreases accordingly, LG_PMPS increases. This may be implemented with add/subtract operations. The implementation is as follows.

In the original domain, when add a least probable symbol, it is considered that the MPS probability decreases to $$\frac{15}{16}$$

of the original probability, and accordingly, $$p_{MPS} = p_{MPS} \times \frac{15}{16}.$$

When mapping to the logarithm domain, LG_PMPS=−256×log($p_{MPS}$)=−256×(log($p_{MPS}$)+log(15)−log(16))≈LG_PMPS+23

Therefore, the following equation may be used for probability prediction, $$LG\_PMPS = LG\_PMPS + 23 \quad (10)$$

After encoding the LPS symbol, the newly computed interval value has to be renormalized.

Specifically, a determination is made according to the computed range_new. If range_new<QUARTER, then range_new is shifted to the left until range_new≧QUARTER. Meanwhile, low_new is shifted to the left by the same number of bits and the bit is outputted to the bit stream.

For example, range_new=$R_1$−$R_2$=$2^{-s_2}$×$t_3$, $s_2$=0x001e and low_new=100100001 may be determined from computation. Because QUARTER=0x0100, $t_3$ may be shifted to the left by 4 bits. In consideration of the effect from $s_2$, it is shifted to the left by 4+2=6 bits in total. Now low has to be shifted to the left by 6 bits correspondingly, and the shifted bits are output to the bit stream. Here, three classifications have to be considered. Assume bit 9 denotes the ninth bit of low_new, which is the bit to be shifted, and bit 8 denotes the eighth bit of low_new. Based on the above classifications, (1) if bit 9 is 1, bit 9 is outputted and then the next output may be performed. In the above example, the first output bit is 1, and low_new=001000010;

(2) if bit 9 is 0 and bit 8 is 0, bit 9 is outputted and then the next output may be performed. In the above example, the second output bit is 0, and low_new=010000100;

(3) if bit 9 is 0 and bit 8 is 1,

Bit 9 is recorded with a bit follow method and bit 8 is toggled to "0" for the next determination of the followed output process. The number of bits to follow is recorded with bits_to_follow, which increases by one with each bit recorded. When outputting the recorded result, if bits_to_follow is not zero, then it is outputted together with the following bits, for example, bits_to_follow=2. When the currently output bit is "0", then "011" is output; when the currently output bit is "1", then "100 is output. In the above example, it is first recorded that bits_to_follow=1 using bit follow method, and bit 9=0, bit 8=0, then "0" is the currently output bit, which is outputted as "01" along with the bit follow bit. low is low_new=000010000 after shifting to the left by two bits.

The output of the last two bits belongs to the second case, which are both "0", low_new=000100000; the five bits "10010" are outputted in total low_new=000100000.

Finally, the update of the parameters is performed after finishing the above computation, including:

defining the new interval as the current interval: range=range_new; and taking the lower limit of the new interval as the lower limit of the current interval: low=low_new.

The value LG_range in the logarithm domain corresponding to the updated interval is LG_range=log (range)≈range−1+Δ=range[7:0], that is, LG_range is obtained by subtracting 1 from the non-updated interval range in the original domain. Further, it may be corrected with a correcting parameter Δ, which is a correction value for approximation and may be determined by referring to a look-up table. The value Δ may be determined from the look-up table same as in the above-described method. Alternatively, the correcting parameter Δ may be ignored, and the updated interval LG_range in the logarithm domain may be derived by subtracting 1 from range directly.

(IV). Encoding Cycle

Based on the encoding method described in sections (II) and (III), the encoding cycle refers to encoding an LPS symbol after encoding zero or a plurality of MPS symbols. The whole encoding process is composed of several encoding cycles. For each encoding cycle, when encoding MPS, interval update is performed in the logarithm domain; when encoding LPS, data is first converted from the logarithm domain to the original domain and then interval update is performed using subtractions in the original domain.

Figure 2:
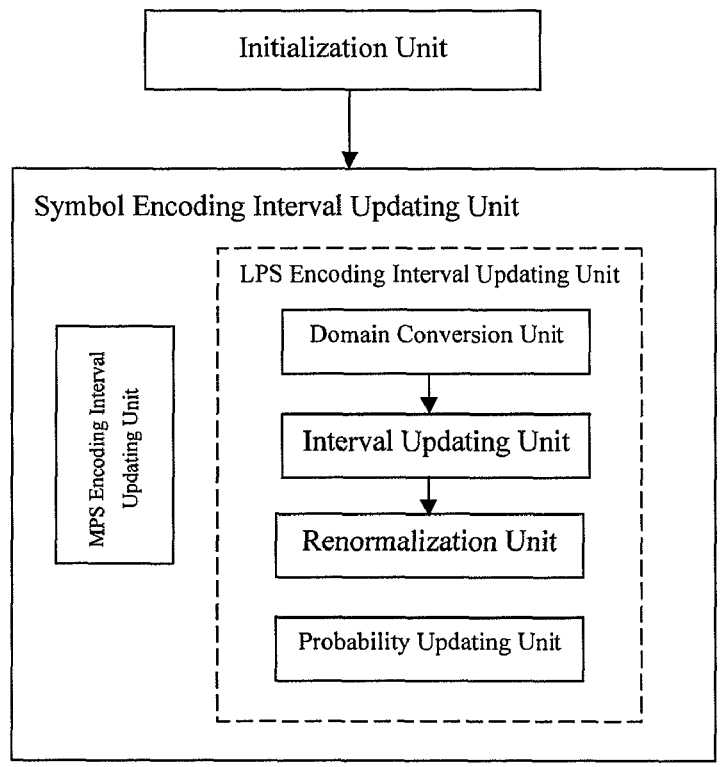
FIG. 2 is a schematic diagram illustrating an embodiment of the arithmetic encoding apparatus according to the invention.

The disclosure also provides an arithmetic encoder, a specific implementation of which is shown in FIG. 2. The encoder may include an initialization unit, a symbol encoding interval updating unit and an encoding operation unit. The symbol encoding interval updating unit further includes a MPS encoding interval updating unit and a LPS encoding interval updating unit. The encoding operation unit makes use of the updated interval calculated by the symbol encoding interval updating unit. Components of the encoder will be explained in the following.

(1) Initialization Unit

The initialization unit is configured to initialize each variable to be used by the arithmetic coder during the encoding process. Specifically, HALF-1 is assigned to the initial value of the Range in the original domain, and QUARTER-1 is assigned to the initial value of LG_Range in the logarithm domain; and 0 is assigned to the lower limit Low of the interval. Here, HALF is a half of the whole encoding interval and QUARTER is a quarter of the whole encoding interval.

(2) MPS encoding interval updating unit

This unit is configured to encode MPS symbols, including interval update and probability update. Assume the probability of the input MPS is LG_PMPS in the logarithm domain and the current interval is LG_Range in the logarithm domain. The update of the interval is a subtract operation, that is, NEWLG_Range=ORGLG_Range−LG_PMPS, and the update of the probability is a subtract operation plus a shifting or a division operation, that is, LG_PMPS=LG_PMPS−LG_PMPS>>4.

(3) LPS Encoding Interval Updating Unit

This unit is configured to encode LPS symbols, which converts the data in the logarithm domain to the original domain and updates the interval using subtractions in the original domain. The LPS encoding interval updating unit includes a domain conversion unit, an interval updating unit, a probability updating unit and a renormalization unit. The domain conversion unit performs data conversions from the logarithm domain to the real domain, with the encoding interval and the interval of MPS being R1 and R2 respectively. The conversion is performed by using equations (6) and (7). The interval updating unit computes the values of Range and Low respectively. Interval update involves a shifting operation to be performed with equation (8). The update of Low involves an add operation performed with equation (9). The update of the probability is an add operation performed with equation (10). The renormalization unit is a shifting unit. Specifically, it makes a determination based on the computed range_new. If range_new<QUARTER, then range_new is shifted to the left until range_new≧QUARTER. Meanwhile, low_new is shifted to the left by the same number of bits and bits are outputted to the bit stream.

The disclosure further provides a method for performing arithmetic decoding. During the decoding process, the updates of the current interval and the probability are exactly the same as that in the encoding. However, instead of maintaining the lower limit Low of the current interval, the offset of the bit stream pointer with respect to the lower limit of the current interval is maintained during the decoding process.

Assume that $LG\_R_1$ (the corresponding value of Range in the logarithm domain) and LG_offset (the corresponding value of Offset in the logarithm domain) may be decomposed into the following difference of the integral part and the fractional part. To simplify subsequent computation, $s_1$ and value_s are the smallest integers not less than $LG\_R_1$ and LG_offset, respectively.

$$\begin{cases} LG\_R_1 = s_1 - t_1 (0 \le t_1 < 1) \\ LG\_offset = offset\_s - offset\_t (0 \le offset\_t < 1) \end{cases} \quad (11)$$

The variables to be maintained during decoding process may include range, offset, $LG\_R_1$ (the fractional part $t_1$) and LG_offset (the fractional part offset_t).

Based on the above assumptions, an embodiment of the decoding procedure may include the following.

(1) Initialize range, and the integral parts and the fractional parts of LG_R and LG_offset, where range is initialized to HALF-1. The initialization of offset is performed by reading a bit stream until finding the first bit of "1". Then offset is initialized to the successive nine bits from this bit. The pseudo code is as follows, where readbits(n) represents successively reading n bits from the bit stream:

```
range=HALF−1.
s₁ = 0
t₁ = 0xFF
offset_s = 0
while(!readbits(1)) offset_s++;
offset_t = readbits(8);
```

(2) Compute a sub-interval corresponding to MPS according to the probability model of the currently decoded symbol. $LG\_R_1$ is the sub-interval of the symbol before decoding, and thus the sub-interval $LG\_R_2$ corresponding to MPS in the logarithm domain satisfies the follow equation:

$$LG\_R2 = LG\_R1 - LG\_MPS \quad (12)$$

(3) The current decoding result is determined. If the sub-interval corresponding to MSP is less than or equal to the offset of the bit stream pointer, that is:

$$LG\_R_2 \ge LG\_offset \quad (13)$$

Then, the symbol is decoded as LPS; otherwise, the symbol is decoded as MPS.

(4) If the symbol is decoded as MPS, the interval update may be rather simple. The current interval $LG\_R_1$ for the decoding process is updated to $LG\_R_2$, then the flow proceeds to step (6) to update the probability model, otherwise, the flow proceeds to step (5).

(5) If the decoded binVal is LPS, then $LG\_R_1$ and LG_offset are converted back to the original domain. The current interval range for the decoding process is updated to the sub-interval corresponding to LPS, and offset is updated to the offset with respect to the new sub-interval. Moreover, range and offset are shifted to the left so that their most significant bits are "1". During the shifting, a part of the bit stream is read so as to prepare for the subsequent decoding.

The size of the sub-interval rLPS corresponding to LPS is $R_1 - R_2$. Its derivation during the decoding is as follows:

$$rLPS \approx 2^{-s_2} g \begin{cases} t_1 - t_2 (\text{if } s_2 = s_1) \\ 1 + (t_1 << 1) - t_2 (\text{if } s_2 = s_1 + 1) \end{cases}$$

Because t1−t2=LG_PMPS when $s_2 = s_1$ and 1+t1−t2=LG_PMPS when $s_2 = s_1 + 1$, the update of rLPS may be written as:

$$rLPS \approx 2^{-s_2} \begin{cases} LG\_PMPS, \text{ if } (s_1 = s_2) \\ t_1 + LG\_PMPS, \text{ if } (s_1 + 1 = s_2) \end{cases}$$

The update of offset may be written as:

$$offset \approx 2^{-s_2} g \begin{cases} offset\_t - t_2 (\text{if } s_2 = offset\_s) \\ 1 + (offset\_t << 1) | readbits(1) - t_2 (\text{if } s_2 = offset\_s + 1) \end{cases}$$

Because rLPS and offset are shifted to the left at the same time, the common factor $2^{-s_2}$ may be ignored.

A shift is made first to the left so that the most significant bit of range is "1". The pseudo code is as follow.

```
while ( rLPS < 0x100 ){
    rLPS = rLPS << 1;
    offset = ( offset << 1 ) | read_bits(1);
}
```

Upon completion, the integral part and fractional part of $LG\_R_1$ are updated as:

$s_1 = 0$;

$t_1 = rLPS[7:0]$;

Then, offset is shifted to the left so that its most significant bit is "1":

```
offset_s = 0;
while ( offset < 0x100 ){
    offset_s++;
    offset = ( offset << 1 ) | read_bits(1);
}
```

Upon completion, the fractional part of LG_offset is updated as:

offset_t=offset[7:0];

(6) Update of the probability estimation, which is exactly the same as that in the encoding, that is:

$$\begin{cases} LG\_p_{MPS} \leftarrow LG\_p_{MPS} + C(\text{if } LPS \text{ occurs}) \\ LG\_p_{MPS} = LG\_p_{MPS} - (LG\_p_{MPS} >> cw)(\text{if } MPS \text{ occurs}) \end{cases} \quad (14)$$

where both C and cw are preset constants.

Figure 3:
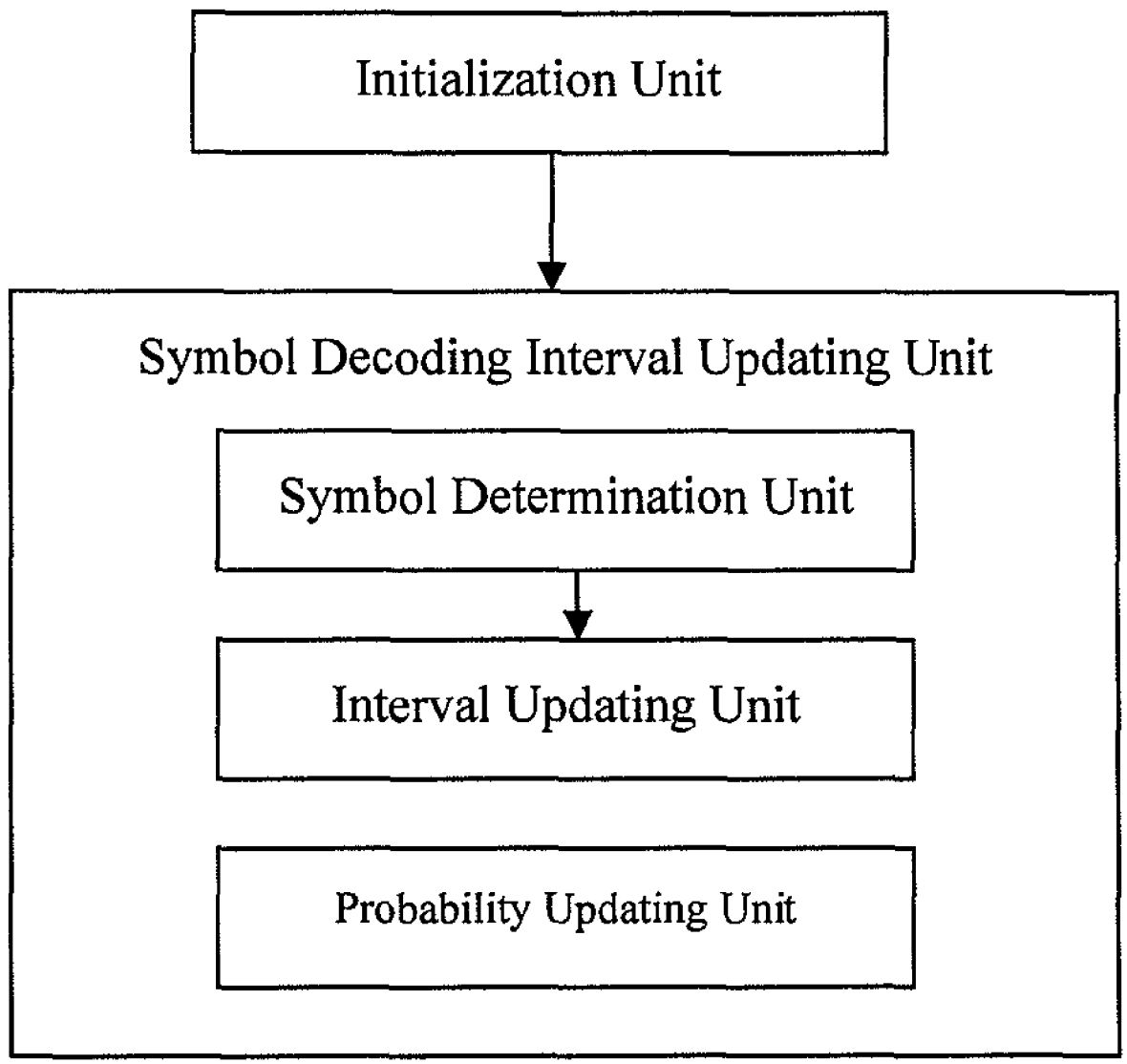
FIG. 3 is a schematic diagram illustrating an embodiment of the arithmetic decoding apparatus according to the invention.

The disclosure also provides an arithmetic decoder, an exemplary embodiment of which is shown in FIG. 3. Specifically, the arithmetic decoder includes an initialization unit, a symbol decoding interval updating unit and a decoding operation unit. When the arithmetic decoder is performing an arithmetic decoding process, the symbol decoding interval updating unit is configured to map an interval update computation to be performed for arithmetic decoding in the original domain into the logarithm domain and implement the interval update computation with add/subtract operations directly, and perform data conversions between the original domain and the logarithm domain by approximations. Further, the symbol decoding interval updating unit may include a symbol determination unit, an interval updating unit and a probability updating unit. The decoding operation unit makes use of the interval updated by the symbol decoding interval updating unit.

Various components of the decoder will be explained in the following.

(1) Initialization Unit

This unit is configured to perform initialization operations for the decoding process and assign values to the variables used during the decoding process. Specifically, it initializes range and the integral parts and fractional parts of LG_R and LG_offset, where range is initialized to HALF-1, while the initialization of offset is done by keeping on reading the bit stream until finding the first bit of "1". Then, offset is initialized to the successive nine bits beginning from the above bit "1".

(2) Symbol Determination Unit

The symbol determination unit performs a subtraction and a comparison. First, it computes the interval of MPS by using equation (12). Then, it determines whether the currently decoded output symbol is MPS or LPS according to the result of equation (13).

(3) Interval Updating Unit

If it is determined by the symbol determination unit that the symbol is MPS, then the offset value is kept the same and the interval is updated to an interval corresponding to MPS, LG_R1=LG_R2. If it is determined that the symbol is LPS, both the interval and the offset need to be updated. This unit performs shifting operations. For details of the shifting operations, please refer to the description of the above decoding process (5).

(4) Probability Updating Unit

This unit reevaluates the probability of MPS according to the currently decoded symbol. The corresponding operations are described in the decoding process (6).

In summary, in the arithmetic encoding process provided by the disclosure, different computation methods are selected for use based on MPS and LPS. During the process, the multiplications of the arithmetic encoding are implemented with add/subtract operations in the logarithm domain and shift operations in the original domain. After encoding each symbol, the probability of MPS is updated, which is performed with add/subtract operations in the logarithm domain. Thus, the disclosure not only maintains the precision of the encoding, but also significantly reduces the computation complexity of the arithmetic encoding and the probability estimation. As a result, a simple and efficient arithmetic encoding method is provided.

As noted above, the disclosure has been described in terms of preferred embodiments, but the scope of the invention is not limited in this context. From the teachings of this disclosure, any person skilled in the art will appreciate that other modifications and alternatives are possible, which shall fall within the scope of the invention. Accordingly, the scope of the invention is to be defined by the appended claims.

The invention claimed is:

1. A method for performing arithmetic encoding, comprising:
   performing arithmetic encoding on data to be encoded;
   mapping an interval update computation in arithmetic encoding to be performed in the original domain into the logarithm domain and implementing the interval update computation with add/subtract operations, wherein data conversions between the original domain and the logarithm domain are performed by approximations; and
   performing arithmetic encoding according to the interval update computation result;
   wherein the data conversion between the logarithm domain and the original domain for a data conversion from the logarithm domain to the original logarithm, comprises:
   deriving a value X in the original domain by shifting a parameter B by A bits to the left or to the right, or by dividing the parameter B by 2 raised to the power of A, wherein the parameters A and B are computed by decomposing Log X in the logarithm domain as Log_X=−A+B−1, where the parameter A is an integer, and the absolute value for the parameter B minus 1 is less than 1.

2. The method of claim 1, wherein for an encoding cycle, interval update is performed in the logarithm domain when encoding a most probable symbol, and
   data conversion is performed from the logarithm domain to the original domain and interval update is performed with subtractions in the original domain when encoding a least probable symbol.

3. The method of claim 1, wherein the parameter B is further derived by correcting the parameter B with a first correcting parameter Δ1 for approximation, the first correcting parameter Δ1 being determined by looking up a pre-stored table.

4. The method of claim 1, wherein during data conversions between the logarithm domain and the original domain, for a data conversion from the original domain to the logarithm domain,
   for a value X in the original domain, its corresponding value Log_X in the logarithm domain is equal to X−1, and,
   when the Log_X is computed, it is corrected with a second correcting parameter Δ2, where Δ2 is determined by looking up a pre-stored table.

5. The method of claim 1, wherein during the interval update computation, the method further comprises:
   selecting and performing different update processes for the probability values of symbols to be encoded, the update processes being performed in the logarithm domain.

6. The method of claim 5, wherein computing a probability in the logarithm domain corresponding to the updated probability comprises determining a new probability by:

adding/subtracting a predetermined value to/from a non-updated probability in the logarithm domain; or shifting the non-updated probability in the logarithm domain by adding/subtracting the value, or dividing the non-updated probability by 2 raised to the power of an integer.

7. An apparatus for performing arithmetic encoding, comprising:

a symbol encoding interval updating unit, configured to map an interval update computation in arithmetic encoding to be performed in the original domain into the logarithm domain and implement the interval update computation with add/subtract operations, and perform data conversions between the original domain and the logarithm domain by approximations; and an encoding operation unit, configured to perform arithmetic encoding with an interval update result computed by the symbol encoding interval updating unit, wherein the symbol encoding interval updating unit further comprises:

a most probable symbol encoding interval updating unit, configured to perform interval update in the logarithm domain when encoding a most probable symbol; and a least probable symbol encoding interval updating unit, configured to convert data in the logarithm domain to the original domain and perform interval update by subtractions in the original domain when encoding a least probable symbol;

wherein the least probable symbol encoding interval updating unit further comprises:

a domain conversion unit, configured to perform a conversion from the logarithm domain to the original domain for the least probable symbol, a value X in the original domain being derived by shifting a parameter B in the logarithm domain by A bits to the left or to the right, or by dividing the parameter B by 2 raised to the power of A, where the parameters A and B are computed by decomposing Log X in the logarithm domain as Log_X=−A+B−1, where the parameter A is an integer, and the absolute value for the parameter B minus 1 is less than 1;

an interval updating unit, configured to perform interval update;

a probability updating unit, configured to update the probability of a symbol; and a renormalization unit, configured to renormalize parameters of an interval update obtained by the interval updating unit.

8. The apparatus of claim 7, further comprising:

an initialization unit, configured to initialize each variable to be used by a coder during encoding, for provision to the symbol encoding interval updating unit to use.

9. A method for performing arithmetic decoding, comprising:

performing arithmetic decoding on data to be decoded;

mapping an interval update computation for arithmetic decoding to be performed in the original domain into the logarithm domain and implementing the interval update computation with add/subtract operations, wherein data conversions between the original domain and the logarithm domain are performed by approximations; and performing arithmetic decoding according to the interval update computation result, wherein the data conversions between the logarithm domain and the original domain, for a data conversion from the logarithm domain to the original logarithm, comprises:

deriving a value X in the original domain by shifting a parameter B by A bits to the left or to the right, or by dividing the parameter B by 2 raised to the power of A, wherein the parameters A and B are computed by decomposing Log_X in the logarithm domain as Log_X=−A+B−1, where the parameter A is an integer, and the absolute value for the parameter B minus 1 is less than 1.

10. The method of claim 9, further comprising:

computing a sub-interval corresponding to a most probable symbol according to a probability model of the decoded data, and determining whether the sub-interval is less than or equal to an offset of a bit stream pointer;

wherein if the determination indicates that the sub-interval is less than or equal to the offset of the bit stream pointer, the decoded symbol is determined to be a least probable symbol, and both the sub-interval and the offset are updated, and if the determination indicates that the sub-interval is more than the offset of the bit stream pointer, the decoded symbol is determined to be a most probable symbol, and only the sub-interval is updated.

11. The method of claim 9, wherein during an interval update computation, the method further comprises:

selecting and performing different update processes for the probability values of symbols to be decoded, the update processes being done in the logarithm domain.

12. The method of claim 9, wherein the parameter B is further derived by correcting the parameter B with a first correcting parameter Δ1 for approximation, the first correcting parameter Δ1 being determined by looking up a pre-stored table.

13. The method of claim 9, wherein during data conversions between the logarithm domain and the original domain, for a data conversion from the original domain to the logarithm domain, for a value X in the original domain, its corresponding value Log_X in the logarithm domain is equal to X−1, and, when the Log_X is computed, it is corrected with a second correcting parameter Δ2, where Δ2 is determined by looking up a pre-stored table.

14. An apparatus for performing arithmetic decoding, comprising:

a symbol decoding interval updating unit, configured to map an interval update computation to be performed for arithmetic decoding in the original domain into the logarithm domain and implement the interval update computation with add/subtract operations directly, and perform data conversions between the original domain and the logarithm domain by approximations; and a decoding operation unit, configured to perform arithmetic decoding with an interval update result computed by the symbol decoding interval updating unit, wherein the symbol decoding interval updating unit further comprises:

a unit, configured to perform a conversion from the logarithm domain to the original domain for a least probable symbol, a value X in the original domain being derived by shifting a parameter B in the logarithm domain by A bits to the left or to the right, or by dividing the parameter B by 2 raised to the power of A, where the parameters A and B are computed by decomposing Log_X in the logarithm domain as Log_X=−A+B−

1, where the parameter A is an integer, and the absolute value for the parameter B minus 1 is less than 1;
an interval updating unit, configured to perform interval update;
a probability updating unit, configured to update the probability of a symbol; and
a renormalization unit, configured to renormalize parameters of an interval update obtained by the interval updating unit.

15. The apparatus of claim 14, wherein the symbol decoding interval updating unit further comprises:
a symbol determination unit, configured to compute a sub-interval corresponding to a most probable symbol according to a probability model of the currently decoded symbol, determine whether the sub-interval is less than or equal to an offset of a bit stream pointer and notify an interval updating unit of the determination result; and
an interval updating unit, configured to update both the sub-interval and the offset if the determination result indicates that the sub-interval is less than or equal to the offset of the bit stream pointer, or only update the sub-interval if the determination result indicates that the sub-interval is more than the offset of the bit stream pointer.

16. The apparatus of claim 14, further comprising:
a probability updating unit, configured to select and perform different update processes on the probability values of symbols to be decoded, the update processes being done in the logarithm domain.

17. The apparatus of claim 14, further comprising:
an initialization unit, configured to initialize each variable to be used by a decoder during decoding, for provision to the symbol decoding interval updating unit to use.

* * * * *